United States Patent [19]
Koh et al.

[11] Patent Number: 5,648,935
[45] Date of Patent: Jul. 15, 1997

[54] SENSE AMPLIFIER

[75] Inventors: Yo Hwan Koh; Chan Kwang Park; Jeung Won Suh, all of Bubal-eub, Rep. of Korea

[73] Assignee: Hyundai Electronics Industries Co., Ltd., Kyoungki-do, Rep. of Korea

[21] Appl. No.: 445,747

[22] Filed: May 22, 1995

[30] Foreign Application Priority Data

May 23, 1994 [KR] Rep. of Korea .................. 94-11173

[51] Int. Cl.$^6$ ............................................. G11C 7/00
[52] U.S. Cl. .................... 365/205; 365/207; 365/208; 327/51; 327/55
[58] Field of Search ....................... 365/205, 207, 365/208; 327/51, 52, 55

[56] References Cited

U.S. PATENT DOCUMENTS

| | | | |
|---|---|---|---|
| 4,644,196 | 2/1987 | Flannagan | 327/52 |
| 4,831,287 | 5/1989 | Golab | 327/55 |
| 4,871,933 | 10/1989 | Galbraith | 365/208 |
| 4,973,864 | 11/1990 | Nogami | 327/55 |
| 5,016,224 | 5/1991 | Tanaka et al. | 365/207 |
| 5,241,503 | 8/1993 | Cheng | 365/208 |

*Primary Examiner*—Son T. Dinh
*Attorney, Agent, or Firm*—Reid & Priest L.L.P.

[57] ABSTRACT

A sense amplifier comprising a data refresh amplifier for supplying voltages to true and complementary bit lines in response to a first control signal to amplify true and complementary data on the true and complementary bit lines, respectively, a first transistor fox amplifying current of the true data on the true bit line in response to a second control signal and transferring the amplified true data to a true input/output line, a second transistor for amplifying current of the complementary data on the complementary bit line in response to the second control signal and transferring the amplified complementary data to a complementary input/output line, a first switch for selectively forming a current path between the true input/output line and the true bit line, and a second switch for selectively forming a current path between the complementary input/output line and the complementary bit line.

3 Claims, 7 Drawing Sheets

SENSE AMPLIFIER

BACKGROUND OF THE INVENTION

1. Field of the Invention

The present invention relates in general to a sense amplifier for use in a semiconductor memory device, and more particularly to a high-speed sense amplifier which is capable of minimizing an occupied area and power consumption and performing data amplification at a high speed.

2. Description of the Prior Art

Generally, a semiconductor memory device such as a dynamic random access memory (referred to hereinafter as DRAM) comprises a plurality of memory cells, each of which includes one transistor and one capacitor. The DRAM has been highly integrated so that it can have a capacity from 256 megabits up to 1 gigabit or more. The high integration of the semiconductor memory device results in limitations in occupied areas of the memory cells and the associated peripheral circuits and increase in capacities and resistances of bit and bus lines.

It is common to use a supply voltage to drive the memory cells and the associated peripheral circuits in the DRAM. The Supply voltage is on a gradually reduced trend as a voltage used in most of information communication equipments is reduced. The reduction of the supply voltage to the DRAM results in reduction in charge storage amounts in the capacitors of the memory cells and in charge transfer amounts from the bit and bus lines. For this reason, data accessed in the DRAM becomes more sensitive to a noise effect. Because of the high integration, the DRAM is required to access the data at a high speed.

A sense amplifier is generally connected to the bit line or the bus line of the semiconductor memory device to sense and amplify the data on the bit line or the bus line. Because of the high integration, the supply voltage reduction and the high-speed operation of the semiconductor memory device, the sense amplifier must be designed to meet the following several factors.

First, the sense amplifier must have a high data sense margin to secure reliability.

Second, the sense amplifier must sense and amplify the data at the high speed suitably to the high-speed operation of the semiconductor memory device.

Third, the sense amplifier must have such a minimized, occupied area that it can be arranged according to a pitch of the bit line.

Finally, the sense amplifier must have a simple control signal related to its operation.

Generally, sense amplifiers designed in consideration of the above factors my be classified into two types, one for sensing and amplifying current on the bit line and the other for sensing and amplifying a voltage on the bit line.

The sense amplifier of the current difference sense type is mainly used in a read only memory (referred to hereinafter as ROM), whereas the sense amplifier of the voltage difference sense type is mainly used in a random access memory (referred to hereinafter as RAM) such as the DRAM. The DRAM has employed the sense amplifier of the current difference sense type beyond 64 megabits, too, because of the supply voltage reduction and transistor's current driving capability.

However, the sense amplifier of the voltage difference sense type is desirable in that it is simple in construction, but has the disadvantage that it senses and amplifies the data at a very low speed. The sense amplifier of the current difference sense type senses and amplifies the data at a relatively high speed as compared with the sense amplifier of the voltage difference sense type. However, the sense amplifier of the current difference sense type requires separate write and read data bus lines, resulting in complexity in a layout of the semiconductor memory device.

Such problems with the sense amplifier of the voltage difference sense type and the sense amplifier of the current difference sense type will hereinafter be described in detail with reference to FIGS. 1 to 3.

Referring to FIG. 1, there is shown a circuit diagram of a DRAM to which a conventional voltage difference sense type-sense amplifier is applied. As shown in this drawing, the DRAM comprises a bit line sense amplifier 11 which includes two PMOS transistors P1 and P2 cross coupled between true and complementary bit lines BL and /BL. The bit line sense amplifier 11 also includes two NMOS transistors N1 and N2 cross coupled between the true and complementary bit lines BL and /BL in a similar manner to the PMOS transistors P1 and P2.

The operation of the DRAM with the above-mentioned construction will hereinafter be described with reference to FIG. 2 which is a timing diagram illustrating operating states of the components in FIG. 1.

First, when a precharge control signal PC is high in logic, half a supply voltage, HVcc, is precharged on the true and complementary bit lines BL and /BL and true and complementary data bus lines DB and /DB. The precharge operation of the true and complementary bit lines BL and /BL is performed by three NMOS transistors N5–N7.

In the case where a bootstrapped high voltage Vpp is transferred to a word line WLi selected by a row decoder (not shown) under the condition that the precharge control signal PC is disabled to low in logic, a voltage charged on a first cell capacitor C1 is supplied to the true bit line BL through an NMOS transistor N3. As a result, a little voltage difference is generated between the true and complementary bit lines BL and /BL.

The bit line sense amplifier 11 is operated when first and second amplification control signals SAP and SAN have a supply voltage Vcc and a ground voltage GND, respectively. As being operated, the bit line sense amplifier 11 allows true and complementary data on the true and complementary bit lines BL and /BL to have the supply voltage Vcc and the ground voltage GND, respectively.

The true and complementary data on the true and complementary bit lines BL and /BL amplified by the bit line sense amplifier 11 are transferred to the true and complementary data bus lines DB and /DB through NMOS transistors N8 and N9, respectively. The NMOS transistors N8 and N9 are turned on when a column transfer control signal Yj goes high in logic by a column decoder (not shown). As being turned on, the NMOS transistors N8 and N9 form transfer paths of the true and complementary data from the true and complementary bit lines BL and /BL to the true and complementary data bus lines DB and /DB, respectively.

The true and complementary data on the true and complementary data bus lines DL and /DL are amplified by a data bus line sense amplifier (not shown) and then transferred to a data output stage.

Referring to FIG. 3, there is shown a circuit diagram of a DRAM to which a conventional current difference sense type-sense amplifier is applied. As shown in this drawing, the DRAM comprises the same memory cells and bit line precharge circuit as those of the DRAM in FIG. 1. The DRAM in FIG. 3 also comprises a bit line sense amplifier 12 which is the same as the bit line sense amplifier 11 in FIG. 1. Further, the DRAM in FIG. 3 comprises true and complementary write bus lines WDB and /WDB fox inputting true and complementary write data, respectively, and true and complementary read bus lines RDB and /RDB fox outputting true and complementary read data, respectively.

The DRAM in FIG. 3 further comprises two NMOS transistors N10 and N11 being turned on when a read select signal YRj is high in logic. As being turned on, the NMOS transistors N10 and N11 connect the true and complementary read bus lines RDB and /RDB to NMOS transistors N12 and N13, respectively: The NMOS transistor N12 is driven in response to the true data on the true bit line BL to open/close a current path between the NMOS transistor N10 and a ground voltage source GND. The NMOS transistor N13 is driven in response to the complementary data on the complementary bit line BL to open/close a current path between the NMOS transistor N11 and the ground voltage source GND. The two NMOS transistors N12 and N13 function to amplify currents of the true and complementary data on the true and complementary bit lines BL and /BL.

The true and complementary write bus lines WDB and /WDB are selectively connected to the true and complementary bit lines BL and /BL by NMOS transistors N14 and N15, respectively. The NMOS transistor N14 is turned on when a write select signal YWj is high in logic. As being ruined on, the NMOS transistor N14 transfers the true write data on the true write bus line WDB to the true bit line BL. The NMOS transistor N15 is turned on when the write select signal YWj is high in logic. As being turned on, the NMOS transistor N15 transfers the complementary write data on the complementary write bus line /WDB to the complementary bit line /BL.

In the DRAM in FIG. 3, the bit line sense amplifier 12 and the two NMOS transistors N12 and N13 for current amplification are connected between the bit lines and the data bus lines so that they can be driven at the same time that the word line is selected. For this reason, the sense amplifier of the current difference sense type can sense and amplify the data at a relatively high speed as compared with the sense amplifier of the voltage difference sense type in FIG. 1.

However, the above-mentioned conventional sense amplifier of the current difference sense type requires the two bus lines for data input/output and the associated drive circuit, resulting in complexity in a layout of the semiconductor memory device.

SUMMARY OF THE INVENTION

Therefore, the present invention has been made in view of the above problem, and it is an object of the present invention to provide a sense amplifier for sensing and amplifying data at a high speed at a low supply voltage and simplifying a layout of a semiconductor memory device.

In accordance with one aspect of the present invention, there is provided a bit line sense amplifier comprising data refresh amplification means for supplying voltages to true and complementary bit lines in response to a first control signal to amplify true and complementary data on the true and complementary bit lines, respectively; first current amplification means for amplifying current of the true data on the true bit line in response to a second control signal and transferring the amplified true data to a true input/output line; second current amplification means for amplifying current of the complementary data on the complementary bit line in response to the second control signal and transferring the amplified complementary data to a complementary input/output line; first switching means for selectively forming a current path between the true input/output line and the true bit line; and second switching means for selectively forming a current path between the complementary input/output line and the complementary bit line.

In accordance with another aspect of the present invention, there is provided a data bus line sense amplifier comprising first current amplification means for amplifying true data on a true data bus line in response to first and second control signals and transferring the amplified true data to a first node; second current amplification means for amplifying complementary data on a complementary data bus line in response to the first and second control, signals and transferring the amplified complementary data to a second node; and third current amplification means for sensing and amplifying a current difference between the first and second nodes in response to a third control signal, the third current amplification means having a differential amplification structure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
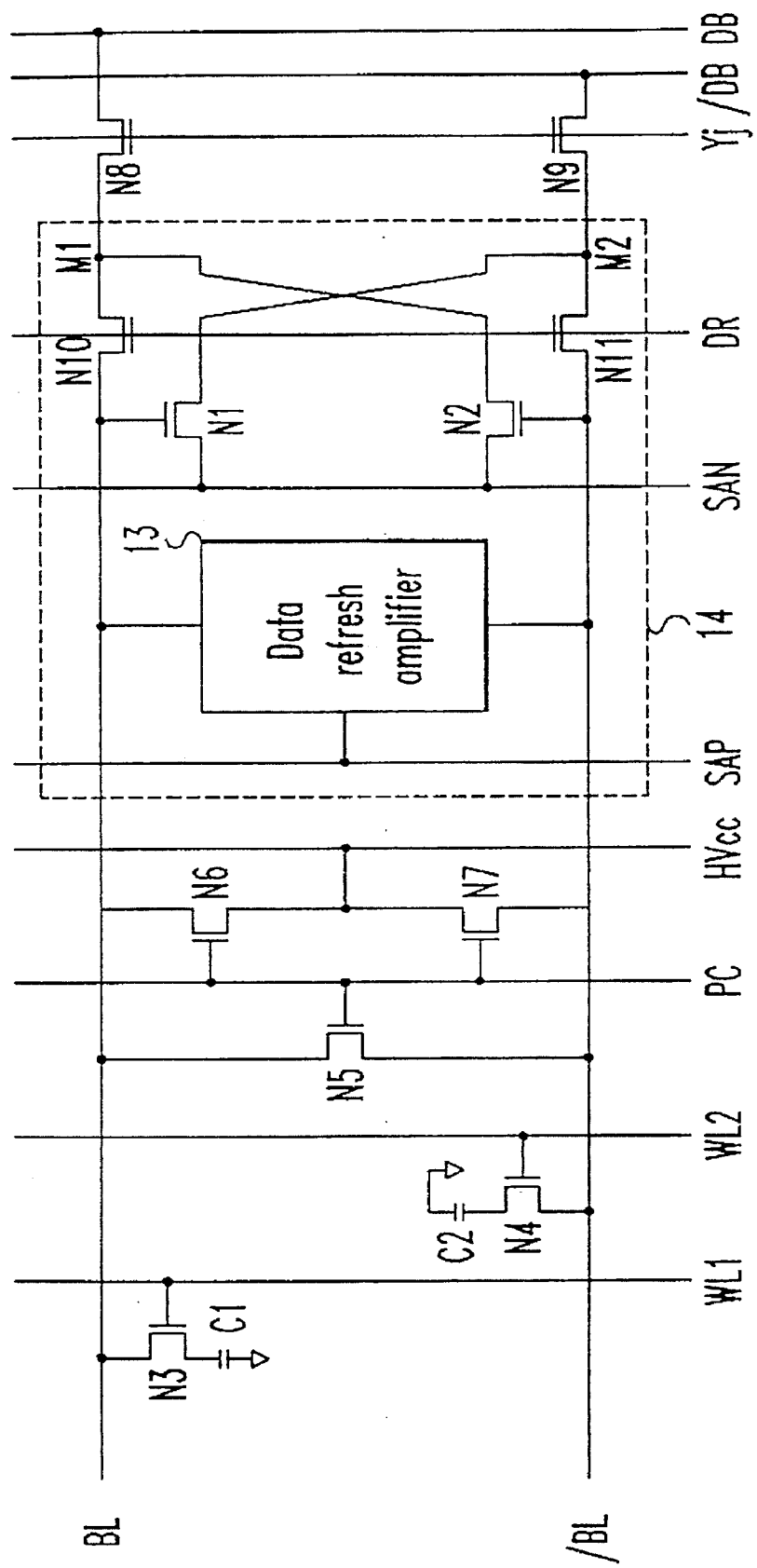
FIG. 4 is a circuit diagram of a DRAM to which a sense amplifier is applied in accordance with a first embodiment of the present invention.

Referring to FIG. 4, there is shown a circuit diagram of a DRAM to which a sense amplifier is applied in accordance with a first embodiment of the present invention. As shown in this drawing, the DRAM comprises a bit line sense amplifier 14 connected between true and complementary bit lines BL and /BL and first and second nodes M1 and M2, an NMOS transistor NS for opening/closing a transfer path between a true data bus line DB and the first node M1, and an NMOS transistor N9 for opening/closing a transfer path between a complementary data bus line /DB and the second node M2.

The bit line sense amplifier 14 includes a data refresh amplifier 13 connected between the true and complementary bit lines BL and /BL to amplify true and complementary data on the true and complementary bit lines EL and /BL in response to a first control signal SAP, an NMOS transistor N1 for bypassing current on the second node M2 in response to a second control signal SAN and the true data on the true bit line BL, and an NMOS transistor N2 for bypassing current on the first node M1 in response to the second control signal SAN and the complementary data on the complementary bit line /BL.

The bit line sense amplifier 14 further includes an NMOS transistor N10 for opening/closing a data transfer path between the true bit line BL and the first node M1 in response to a third control signal DR, and an NMOS transistor N11 for opening/closing a data transfer path between the complementary bit line /BL and the second node M2 in response to the third control signal DR.

The two NMOS transistors N10 and N11 are driven in both data write and read modes. The two NMOS transistors N1 and N2 are driven in only the data read mode to form a latch circuit with the two NMOS transistors N10 and N11.

In the data read mode, when one of word lines WL1 and WL2 is selected by a row decoder (not shown), a voltage stored on a cell capacitor C1 or C2 is transferred to the true or complementary bit line BL or /BL through an NMOS transistor N3 or N4. If the first and third control signals SAP and DR are high in logic and the second control signal SAN is low in logic, the bit line sense amplifier 14 current-amplifies the true and complementary data on the true and complementary bit lines BL and /BL and transfers the amplified true and complementary data to the first and second nodes M1 and M2, respectively. The NMOS transistors N8 and N9 are enabled when a column control signal Yj is high in logic. As being enabled, the NMOS transistors N8 and N9 transfers the true and complementary data on the first and second nodes M1 and M2 to the true and complementary data bus lines DB and /DB, respectively.

The operation of the bit line sense amplifier 14 will hereinafter be described in more detail.

The data refresh amplifier 13 is driven when the first control signal SAP is high in logic. As being driven, the data refresh amplifier 13 amplifies any one of the true and complementary data on the true and complementary bit lines BL and /BL to a supply voltage level Vcc.

When the second control signal SAN is low in logic, the NMOS transistor N1 bypasses aria mount of the current on the second node M2 corresponding to a voltage level on the true bit line BL to a source of the second control signal SAN. Similarly, when the second control signal SAN is low in logic, the NMOS transistor N2 mutes an amount of the current on the first node M1 corresponding to a voltage level on the complementary bit line /BL to the source of the second control signal SAN. In result, a current difference between the true and complementary bit lines BL and /BL is amplified by the two NMOS transistors N1 and N2 and then transferred to the first and second nodes M1 and M2.

The NMOS transistor N10 is driven when the third control signal DR is high in logic. As being driven, the NMOS transistor N10 opens the data transfer path between the true bit line BL and the first node M1. Similarly, the NMOS transistor N11 is driven when the third control signal DR is high in logic. As being driven, the NMOS transistor N11 opens the data transfer path between the Complementary bit line /BL and the second node M2. In result, the two NMOS transistors N10 and N11 transfers the amplified true and complementary data on the first and second nodes M1 and M2 to the cell capacitors C1 and C2 through the true and complementary bit lines BL and /BL, respectively, to refresh the cell capacitors C1 and C2.

In result, the true and complementary data on the true and complementary bit lines BL and /BL are voltage-amplified by the data refresh amplifier 13 and then current-amplified by the two NMOS transistors N1 and N2. The voltage and current-amplified true and complementary data are transferred to the first and second nodes M1 and M2, respectively. The third control signal DR is enabled later by a predetermined time than the first and second control signals SAP and SAN. Preferably, the third control signal DR may be enabled simultaneously with the first and second control signals SAP and SAN. The first and the second control signals SAP and SAN are enabled at the same time that the word line WL is enabled. For this reason, the bit line sense amplifier can sense and amplify the true and complementary data on the true and complementary bit lines BL and /BL at a high speed.

Figure 1:
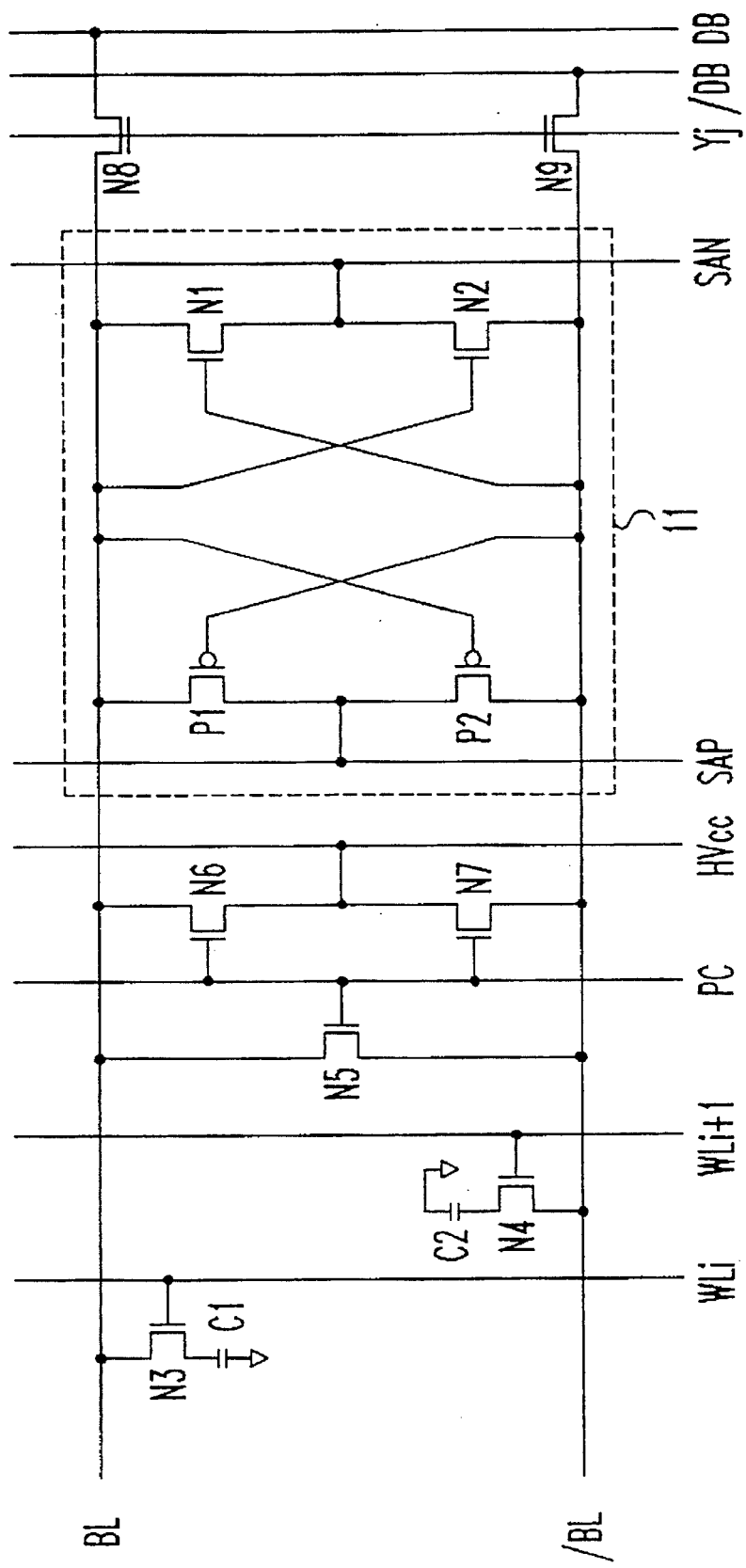
FIG. 1 is a circuit diagram of a DRAM to which a conventional voltage difference sense type-sense amplifier is applied.
Figure 2:
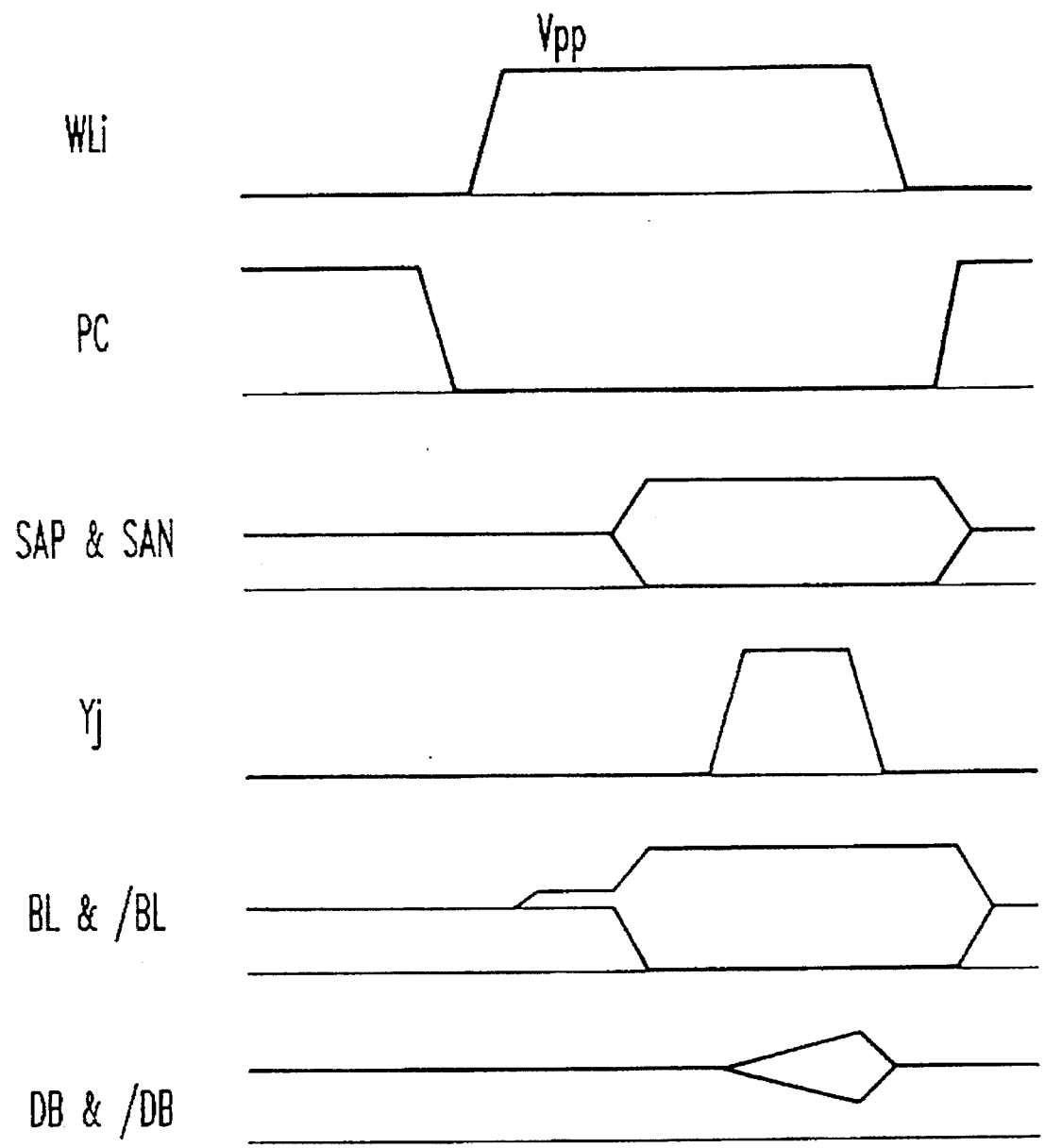
FIG. 2 is a timing diagram illustrating operating states of components in FIG. 1.
Figure 3:
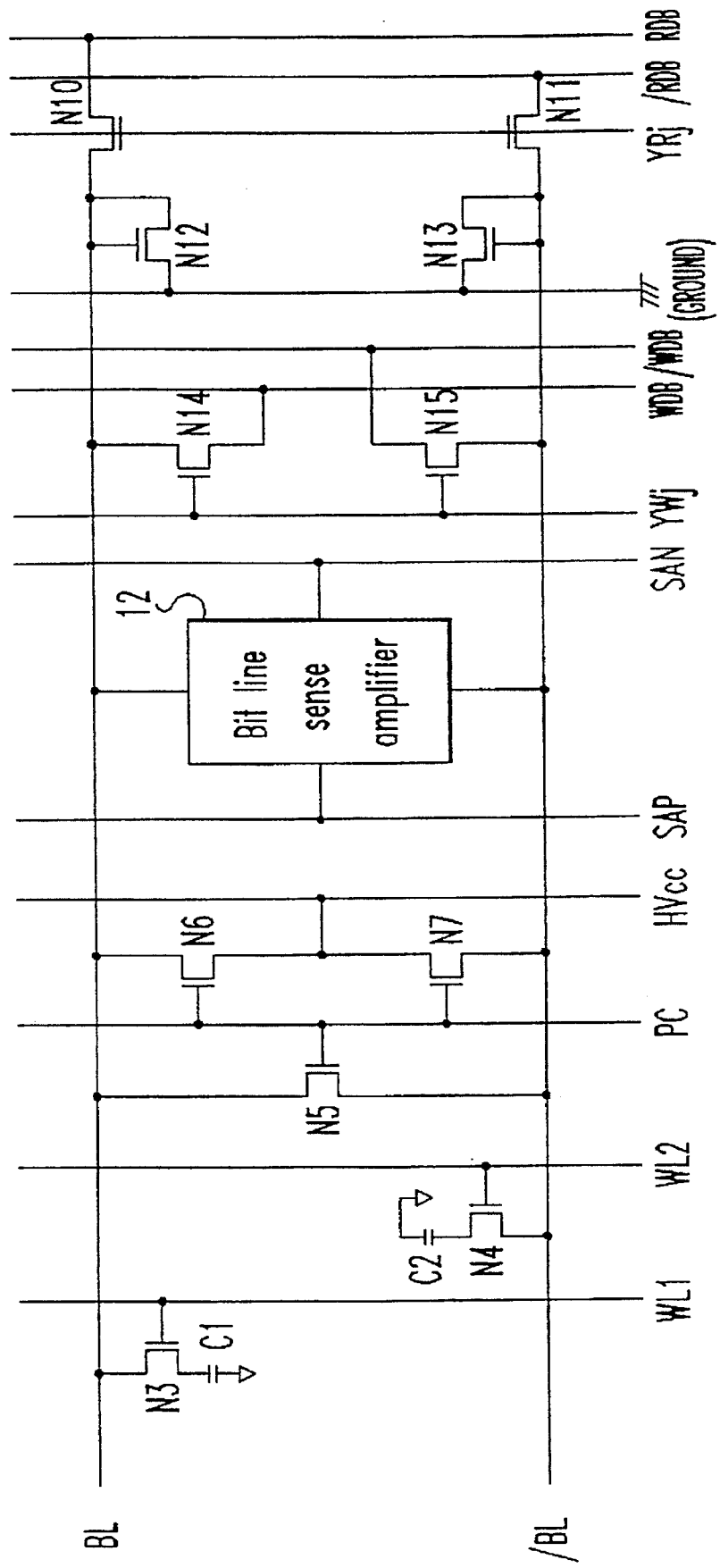
FIG. 3 is a circuit diagram of a DRAM to which a conventional current difference sense type-sense amplifier is applied.

In accordance with the present invention, the bit line sense amplifier has a simple construction and a small occupied area because it comprises the smaller number of transistors as compared with the sense amplifier of the current difference sense type in FIG. 3. Also, the bit line sense amplifier requires the single bus line for data input/output. In this connection, the bit line sense amplifier of the present invention has the effect of simplifying a layout of a semiconductor memory device.

Figure 5:
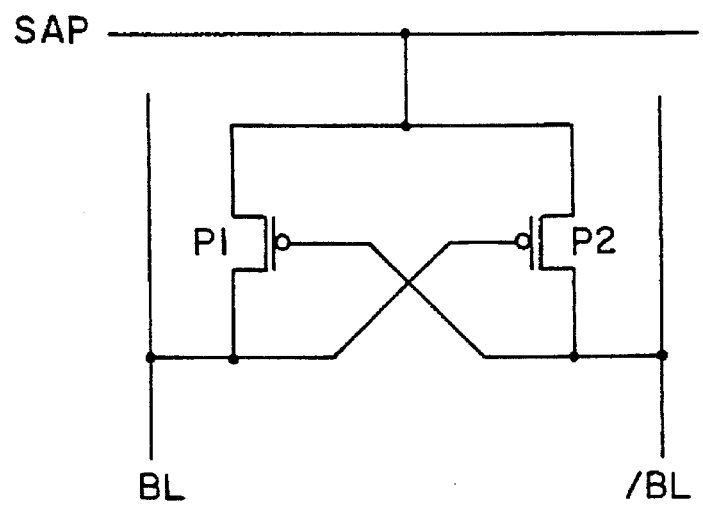
FIG. 5 is a detailed circuit diagram of an embodiment of a data refresh amplifier in FIG. 4.

Referring to FIG. 5, there is shown a detailed circuit diagram of an embodiment of the data refresh amplifier 13 in FIG. 4. As shown in this drawing, the data refresh amplifier 13 includes a first PMOS transistor P1 being selectively driven in response to the voltage level on the complementary bit line /BL. The first PMOS transistor P1 is turned on when the complementary data on the complementary bit line /BL is low in logic. As being turned on, the first PMOS transistor P1 transfers the first Control signal SAP to the true bit line BL.

The data refresh amplifier 13 further includes a second PMOS transistor P2 being selectively driven in response to the voltage level on the true bit line BL. The second PMOS transistor P2 is turned on when the true data on the true bit line BL is low in logic. As being turned on, the second PMOS transistor P2 transfers the first control signal SAP to the complementary bit line /BL.

In result, the first and second PMOS transistors P1 and P2 are cross coupled between the true and complementary bit lines BL and /BL to voltage-amplify any one of the true and complementary data on the true and complementary bit lines BL and /BL.

Figure 6:
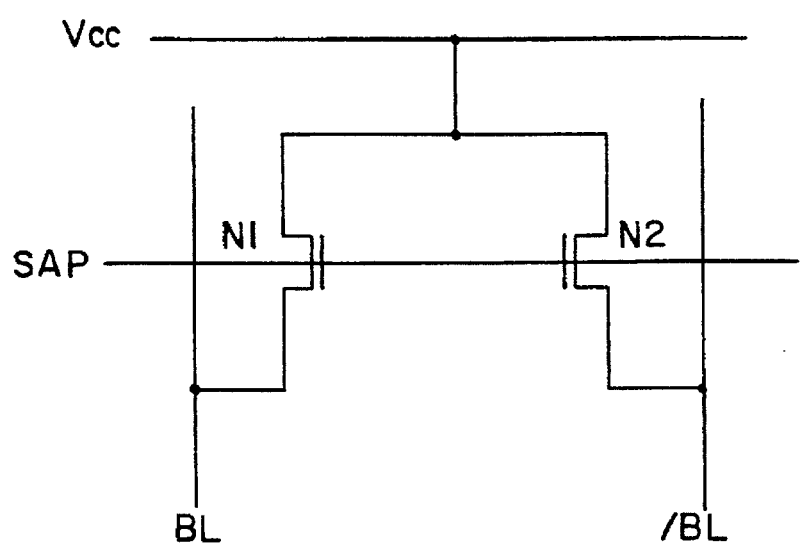
FIG. 6 is a detailed circuit diagram of an alternative embodiment of the data refresh amplifier in FIG. 4.

Referring to FIG. 6, there is shown a detailed circuit diagram of an alternative embodiment of the data refresh amplifier 13 in FIG. 4. As shown in this drawing, the data refresh amplifier 13 includes NMOS transistors N1 and N2 instead of the PMOS transistors P1 and P2 in FIG. 5, since the NMOS transistors can significantly reduce an layout area as compared with the PMOS transistors. The reduction of the layout area results from all the transistors in the sense amplifier being of the N type.

Figure 7:
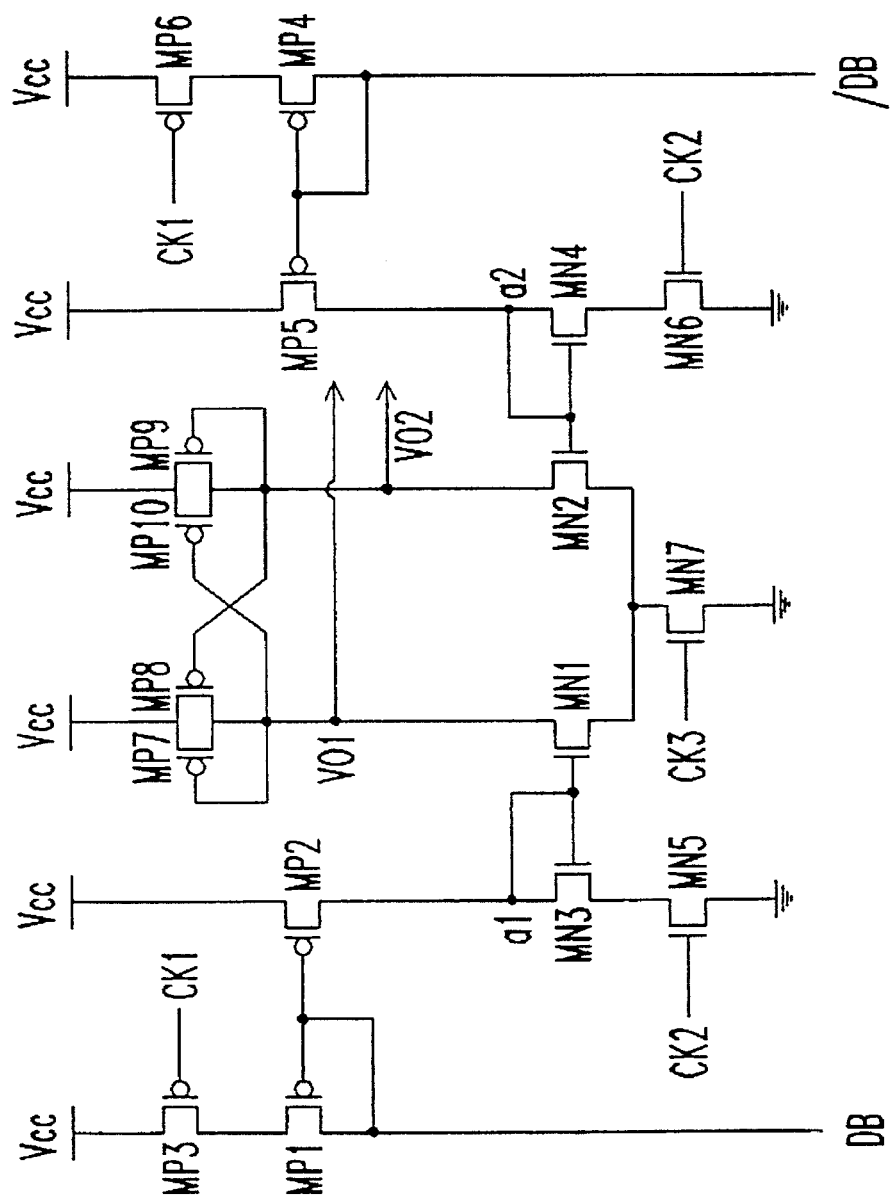
FIG. 7 is a circuit diagram of a sense amplifier in accordance with a second embodiment of the present invention.

Referring to FIG. 7, there is shown a circuit diagram of a sense amplifier in accordance with a second embodiment of the present invention. In the second embodiment, the sense amplifier is adapted to sense a current difference between true and complementary data bus lines DB and /DB and will thus be referred to hereinafter as a data bus line sense amplifier.

The data bus line sense amplifier comprises a first current amplification part for amplifying true data on the true data bus line DB in response to first and second control signals CK1 and CK2 and outputting the amplified true data to a first node a1, a second current amplification part for amplifying complementary data on the complementary data bus line /DB in response to the first and second control signals CK1 and CK2 and outputting the amplified complementary data to a second node a2, and a third current amplification part for Sensing and amplifying a current difference between the true and complementary data on the first and second nodes a1 and a2 in response to a third control signal CK3 and outputting the resultant true and complementary data to first and second output terminals VO1 and VO2, respectively.

The first current amplification part includes a transistor MP3 having a gate for inputting the first control signal CK1 and a source for inputting a supply voltage Vcc, a transistor MP1 having a source connected to a drain of the transistor MP3 and a gate and a drain connected in common to the true data bus line DB, a transistor MP2 having a source for inputting the supply voltage Vcc, a gate connected to the true data bus line DB and a drain connected to the first node a1, a transistor MN3 connected in a diode manner, and a transistor MN5 connected between a source of the transistor MN3 and a ground voltage GND. The transistor MN5 has a gate for inputting the second control signal CK2.

The second current amplification part includes transistors MP6, MP4, MP5, MN4 and MN6 connected between the Complementary data bus line /DB and the second node a2 in the same manner as those in the first current amplification part.

The third current amplification part includes transistors MP7, MP8, MP9 and MP10 cross coupled between the first and second output terminals VO1 and VO2, transistors MN1 and MN2 having drains connected respectively to the first and second output terminals VO1 and VO2, gates connected respectively to the first and second nodes a1 and a2 and sources connected in common, and a transistor MN7 connected between the con, non sources of the transistors MN1 and MN2 and the ground voltage GND. The transistor MN7 has a gate for inputting the third control signal CK3.

The operation of the data bus line sense amplifier with the above-mentioned construction in accordance with the second embodiment of the present invention will hereinafter be described in detail.

Assume that the current difference was generated between the true and complementary data bus lines DB and /DB because true and complementary data from true and complementary bit lines (not shown) were transferred to the true and complementary data bus lines DB and /DB. In the case where the first control signal CK1 is enabled to low in logic and after the lapse of a predetermined time period the second control signal CK2 is enabled to high in logic, the current signals on the true and complementary data bus lines DB and /DB are amplified and then transferred to the first and second nodes a1 and a2, respectively.

If the current difference between the signals on the first and second nodes a1 and a2 is sufficient, it is amplified by the third current amplification part when the third control signal CK3 is enabled to high in logic. In more detail, in the third current amplification part, the transistors MN1 and MN2 increase current amounts flowing to the first and second output terminals VO1 and VO2 on the basis of current amounts on the first and second nodes a1 and a2 which flow to the gates of the transistors MN1 and MN2, respectively. As a result, the current difference between the first and second nodes a1 and a2 is amplified and then applied to the first and second output terminals VO1 and VO2. The four transistors MP7, MP8, MP9 and MP10 are all of the P type to act as load resistors for a pull-up operation of the first and second output terminals VO1 and VO2.

Figure 8:
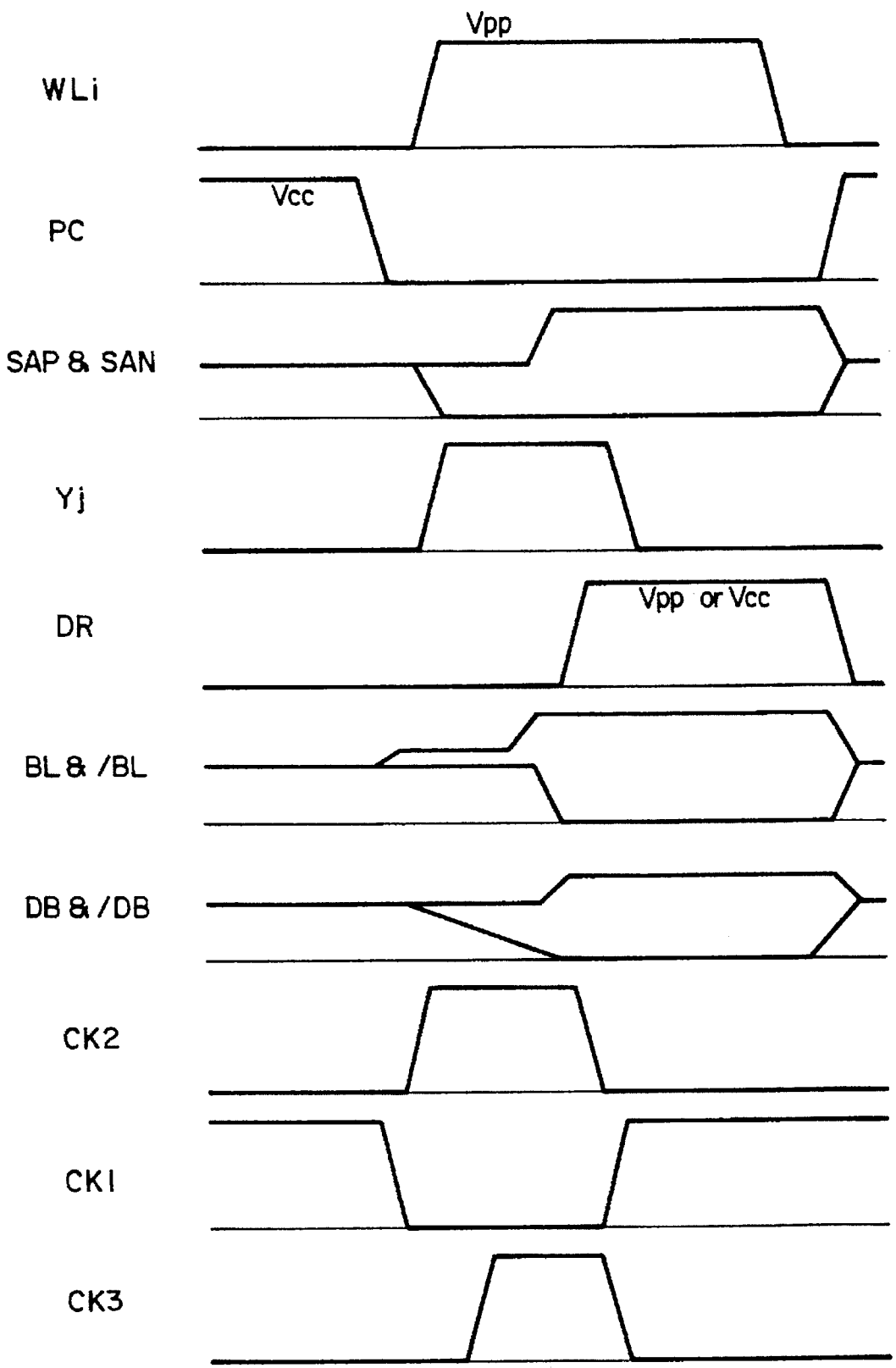
FIG. 8 is a timing diagram illustrating operating states of components in FIGS. 4 and 7.

FIG. 8 is a timing diagram illustrating the operating states of the components in FIGS. 4 and 7. As shown in this drawing, the second control signal SAN goes low in logic when the word line WLi and the column transfer signal Yj go high in logic. At this time, the bit line sense amplifier begins to perform the data sense operation. The true and complementary data on the true and complementary bit lines BL and /BL ale current-amplified by the transistors N1 and N2 in FIG. 4 and then transferred to the true and complementary data bus lines DB and /DB. The transferred true and complementary data are sensed by the data bus line sense amplifier.

In the data bus line sense amplifier, the first control signal CK1 to the data bus line sense amplifier is changed from high to low in logic simultaneously with or slightly later than the second control signal SAN to the bit line sense amplifier. At this time, if the current difference is generated between the true and complementary data bus lines DB and /DB, the second and third control signals CK2 and CK3 to the data bus line sense amplifier are enabled, thereby causing the data bus line sense amplifier to be operated. At that time the data sense operation is completed, the column transfer signal Yj is disabled to low in logic, and the true and complementary data refreshed by the first and third control signals SAP and DR to the bit line sense amplifier are stored in the memory cells. Then, the bit line sense amplifier is changed to the precharged state.

As apparent from the above description, according to the present invention, the sense amplifier can sense and amplify the data at the high speed since it is enabled simultaneously with the word line. The sense amplifier of the present invention is capable of current and voltage-amplifying the data, so that it can minimize a noise effect. The sense amplifier of the present invention has the simple construction and the small occupied area because it comprises the smaller number of transistors as compared with the conventional sense amplifier of the current difference sense type. Further, the sense amplifier of the present invention requires the single bus line for data input/output. Therefore, the sense amplifier of the present invention has the effect of simplifying the layout of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data bus line sense amplifier comprising:
    first current amplification means for amplifying true data on a true data bus line in response to first and second control signals and transferring the amplified true data to a first node;
    second current amplification means for amplifying complementary data on a complementary data bus line in response to the first and second control signals and transferring the amplified complementary data to a second node; and
    third current amplification means for sensing and amplifying a current difference between said first and second nodes in response to a third control signal, said third current amplification means-having a differential amplification structure.

2. A data bus line sense amplifier as set forth in claim 1, wherein said first current amplification means includes:
    a first PMOS transistor having a source for inputting a supply voltage and a gate for inputting the first control signal;

a second PMOS transistor having a source connected to a drain of said first PMOS transistor and a gate and a drain connected in common to said true data bus line;

a third PMOS transistor having a source for inputting the supply voltage, a gate connected to said true data bus line and a drain connected to said first node;

a first NMOS transistor having a drain and a gate connected in common to said first node, said first NMOS transistor having a diode structure; and a second NMOS transistor having a drain connected to a source of said first NMOS transistor, a source connected to a ground voltage source and a gate fox inputting the second control signal.

3. A data bus line sense amplifier as set forth in claim 1, wherein the first to third control signals are enabled at a predetermined time interval as a data sense operation is advanced.

* * * * *